United States Patent [19]

Guthrie et al.

[11] Patent Number: 5,081,953
[45] Date of Patent: Jan. 21, 1992

[54] CENTER SECTION FOR COATING HOOD FOR GLASS CONTAINERS

[75] Inventors: Roger T. Guthrie, Spartanburg, S.C.; Raymond W. Barkalow, Jackson, N.J.

[73] Assignee: Atochem North America, Inc., Philadelphia, Pa.

[21] Appl. No.: 428,375

[22] Filed: Oct. 27, 1989

[51] Int. Cl.$^5$ .............................. C23C 16/00
[52] U.S. Cl. .................. 118/715; 118/719; 118/725; 427/255; 65/60.51
[58] Field of Search ............... 118/715, 725, 719; 427/255; 65/60.51

[56] References Cited

U.S. PATENT DOCUMENTS 4,431,692 2/1984 Hofmann .................. 65/60.51
4,529,627 7/1985 Zurbig ..................... 427/255
4,615,916 10/1986 Henderson .............. 65/60.51

Primary Examiner—Richard Bueker
Attorney, Agent, or Firm—Stanley A. Marcus; Robert B. Henn

[57] ABSTRACT

Improved apparatus for coating glass containers provides a coating on the body for improved resistance to impact breakage and abrasion, while coating of threads or lugs at the open tops of the containers is limited to about one-tenth, or less, of the coating on the surfaces of the body, which surfaces are exposed to contact with other containers during handling. The apparatus provides a laminar flow of fluid which is free of coating-precursor chemical over the threads or lugs in a manner which minimizes turbulence and intermixing with the coating stream.

7 Claims, 4 Drawing Sheets

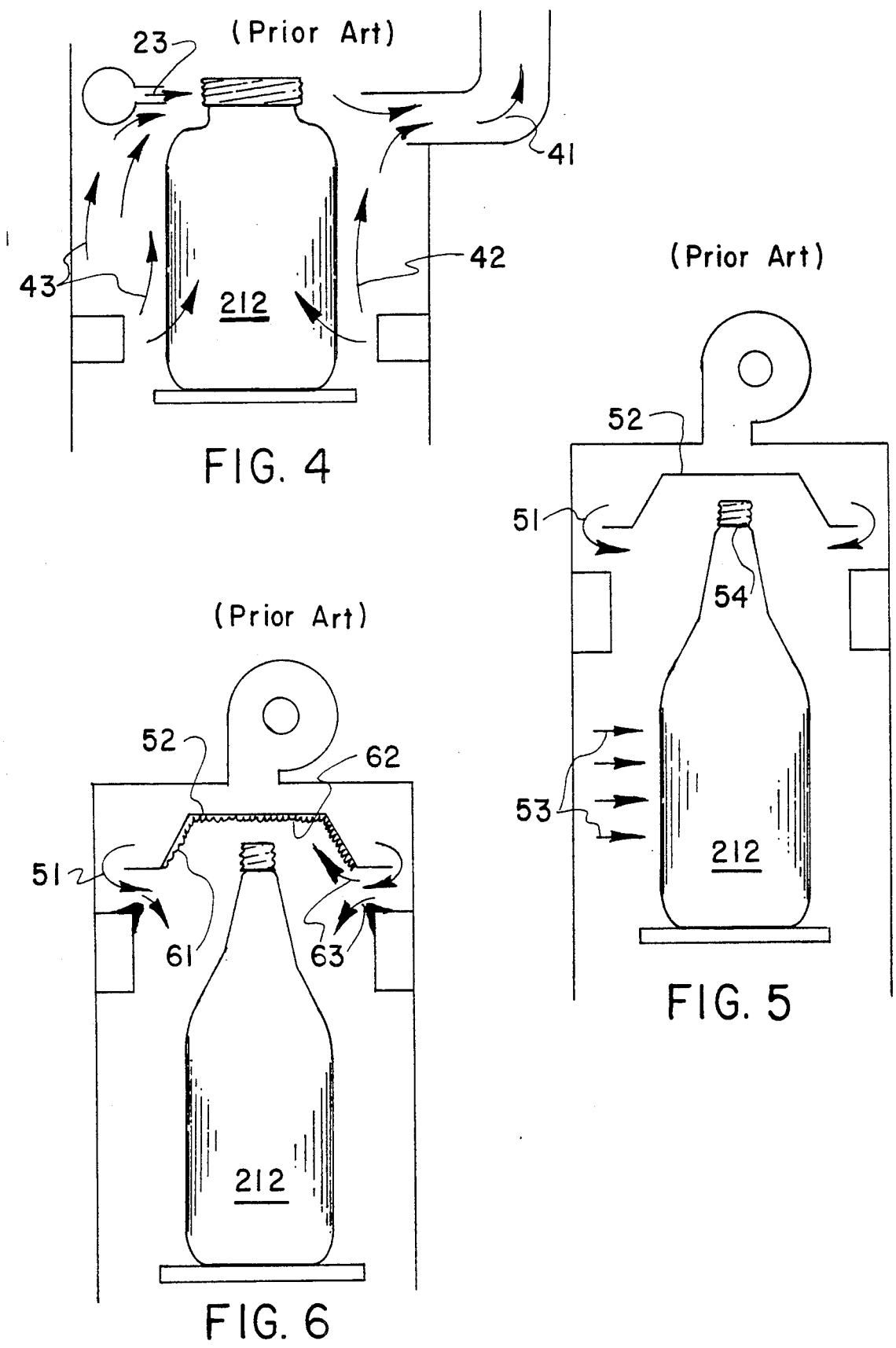

under CENTER SECTION FOR COATING HOOD FOR GLASS CONTAINERS

BACKGROUND OF THE INVENTION

1. Field of the Invention

This invention is in the field of methods and apparatus for the application of coatings to glass containers. More particularly, the present invention is in the field of methods and devices for control of the application of coatings of varying thicknesses to bottles, jars and the like.

2. Description of the Prior Art

The utility of glass bottles and jars has been broadened by surface coating to decrease abrasion and breakage as taught by Carl, et al., U.S. Pat. No. 3,323,889; Gatchet, et al., U.S. Pat. No. 3,516,811; Scholes, et al., U.S. Pat. No. 3,819,404; Hofmann, et al., U.S. Pat. No. 4,431,692; Lindner, et al., U.S. Pat. No. 4,668,268, and others. Gatchet observed the utility of avoiding all coating on the closure region of the container, known in the art as the "finish". In U.S. Pat. No. 4,431,692, Hofmann taught maintaining the finish out of contact with the treatment gas. Several of the prior workers in this field recognized the existence of non-linear currents in the coating precursor stream, including omnidirectional turbulent currents and upwardly-moving convention currents.

While well-adjusted coating hoods of the prior art can provide an acceptably high body coating with acceptably low finish coating for a period of time, we have identified destabilizing effects not completely controlled by the prior art. When a well-adjusted coating hood is converted to the coating of a different container, not all of the careful adjustments survive, nor do adjustments for a given style of container always stay within acceptable ranges for the duration of a coating run.

Those skilled in the art will realize that turbulent and connection currents, and the current caused by impingement of the coating current upon the moving glass containers, will vary when production is changed to ware of differing mass, dimension, shape, production speed, spacing on the conveyor belt, or any combination of those and other production variables. Even with sufficient time and adequate instrumentation, it has been found virtually impossible to readjust the balance of finish-protection and coating streams quickly and economically. But once that balance has been reestablished, it can shift, as when a single section of the forming line comes on or goes off stream, or any of the variables mentioned above changes again. Additionally, the balance will drift, as coating vapors slowly pyrolyze on the coating tunnel, building up to thickness levels which cause disruption of the normal flow of the process streams.

In the teaching of the prior art, a limiting factor arises when the finish-protection stream must be increased, and this factor of itself causes unintended currents, including deflection at the point of impingement upon the finish, swirling of the adjacent air mass, and induced drafts. FIGS. 1 through 6 show the tendency of these unintended currents to bring coating vapors into the vicinity of the finish, in the operation of coating apparatus of the prior art. In each of the figures discussed here, the representation is simplified for purposes of illustrating the principal differences between the prior art and the present invention.

FIG. 1, after Gatchet, shows the idealized, essentially horizontal flow of the coating stream 11 across the path of moving bottles 212.

FIG. 2, from the disclosure of Frank, U.S. Pat. No. 3,623,854, shows the use of convection currents 21 caused by the hot glass container 212 heating the ambient air to effect upward distribution of coating vapors from jets 22 positioned below the center of the bottle, and his use of a jet 23 of clean air to prevent coating of the finish by the convection currents.

FIG. 3 shows deflection of the horizontal coating stream 11 of Gatchet by impingement upon the glass surface 31. Those skilled in the art will understand that the convective upward deflection 32 as taught by Frank is also present, as are multiple turbulent currents 33 caused by interaction of the various gaseous streams with each other, and with the moving ware 212.

FIG. 4 shows the induced draft 41, carried along by Frank's jet of clean air 23 and combining therewith, because the pressure in jet 23 is reduced by its relatively higher velocity. Air 42, replacing the air taken away by induced draft 41, rises through the coating stream because of both the lower pressure above and the convection current 43 created by the heat from bottle 212.

FIG. 5 shows an advanced embodiment of the prior art as disclosed by Lindner et al. in U.S. Pat. No. 4,668,268, wherein a large volume of low-pressure air from finish-protection jets 51 floods the upper portion of the center section 52, preventing most of the coating vapors 53 from reaching the finish region 54 of bottle 212.

FIG. 6 shows the center section 52 of FIG. 5 after two months of substantially continuous operation. The combination of high-energy convection and impingement currents, plus induced drafts, turbulence, and diffusion into the low-energy air mass above, has gradually deposited coating 61 on the inner walls 62 of center section 52 until the deposit is several millimeters (mm.) thick, and has begun to clog finish-protection jets 51, leading to turbulent currents 63 in the process, an even more rapid deposit formation, complete blockage of the finish-protection jets 51, and resultant undesirable heavy coating of the finish 54.

It is known in the prior art to direct a finish-protecting stream of clean air downward toward the finish, from stream-directing means in the roof of the coating tunnel. Unfortunately, if the downward stream has the velocity required to stop the upward components of the turbulent, impingement, and convection currents, it can seriously dilute and displace the coating-precursor current in the shoulder region, where the surface protection provided by an adequate coating level is critical. The operator of the coating system is then faced with the choice of having unacceptably thick coating on the finish, or unacceptably low coating in the shoulder region, on an unacceptably high percentage of the processing run.

SUMMARY OF THE INVENTION

The present invention is an improved hood for glass-container-coating operations having a center or roof section of the coating tunnel, with a downwardly-directed fluid stream of sufficient energy to overcome extraneous upwardly-directed fluid streams, giving essentially no coating on the finish region of the ware, in combination with a horizontally-disposed air curtain or other exhaust means intermediate between the finish and the shoulder of the ware being coated, the horizontal flow being so powered as to prevent displacement of the coating-precursor stream from the shoulder of the ware.

BRIEF DESCRIPTION OF THE DRAWINGS

FIGS. 1 through 6 show limitations of the prior art.

DESCRIPTION OF THE PREFERRED EMBODIMENTS

The present invention is an improved hood for coating operations on glass containers, comprising a roof section of the coating tunnel having a downwardly-directed fluid stream of sufficient energy to overcome upwardly-directed fluid streams, such upward streams generally carrying entrained coating-precursor chemical, in combination with a horizontally-disposed air curtain or other exhaust means intermediate between the finish and the shoulder of the ware being coated, the horizontal flow being so powered as to prevent displacement of the coating-precursor stream from the shoulder of the ware, the combination of the horizontal and downwardly-directed streams thereby permitting essentially no coating on the finish region of the ware, while the body of the wares receives adequate coating.

We have discovered that the thickness of the coating on the finish can be controlled at or near zero by a sufficiently energetic down-flow of gas containing no coating-precursor material, and that the shoulder coating is undiminished if the down-flowing gas stream is either deflected by a horizontally-disposed air current, or removed by horizontally-disposed exhaust means intermediate between the finish and the shoulder of the bottles being coated, or by a combination of these means.

Figure 1:
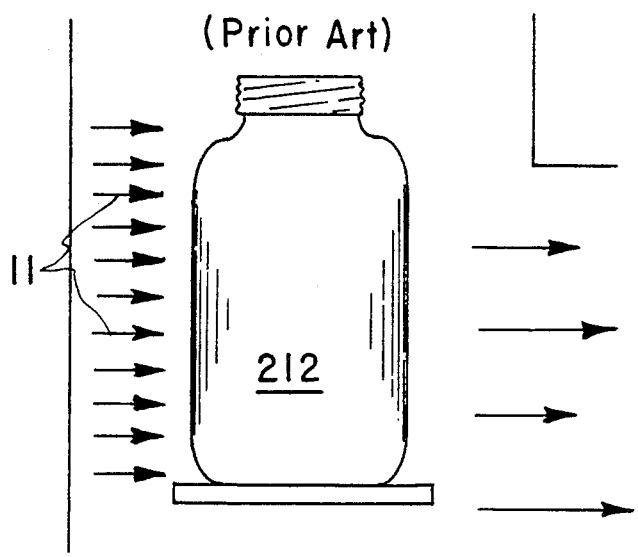
Figure 2:
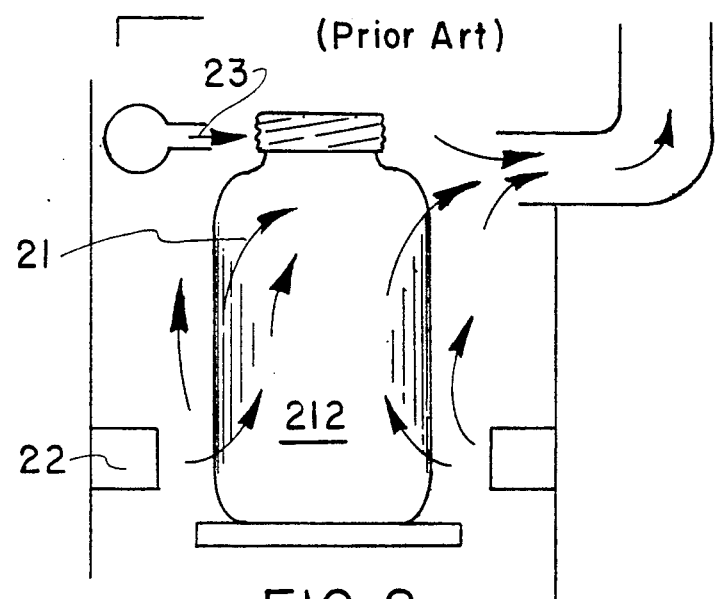
Figure 3:
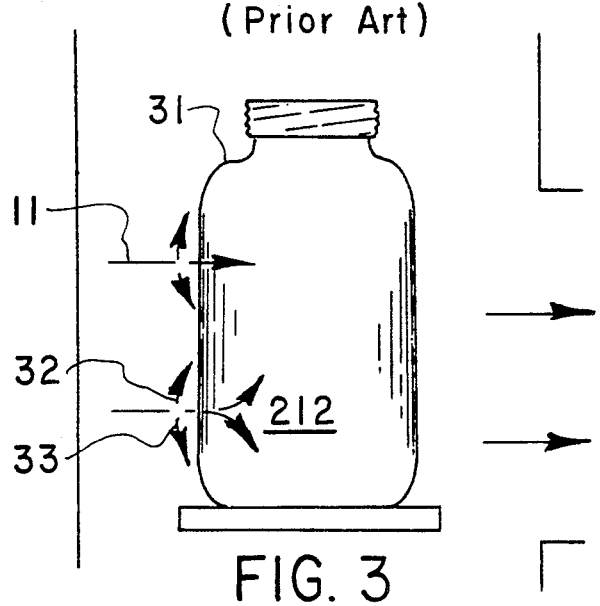
Figure 7:
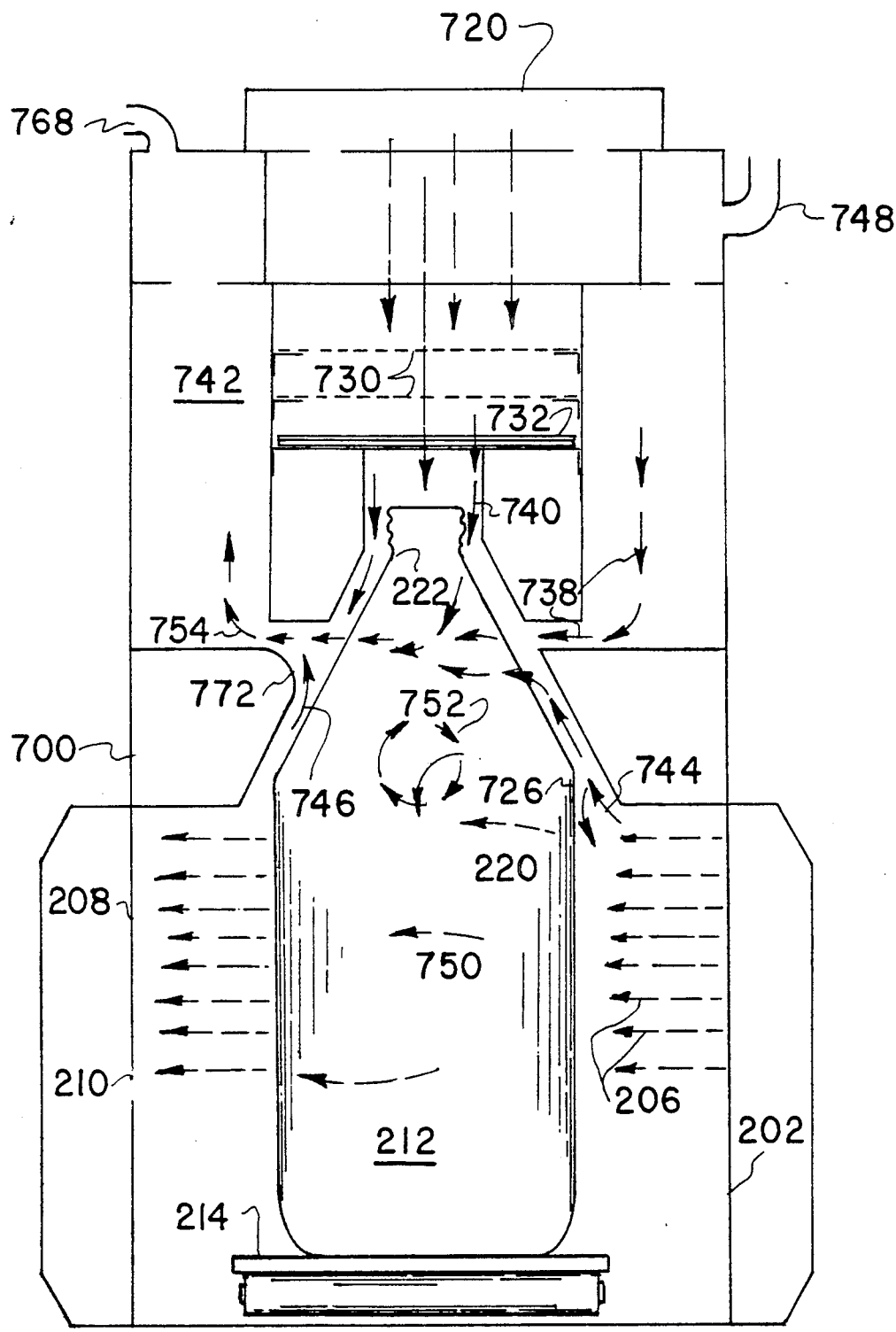
FIG. 7 is an elevation showing a coating hood of this invention.
Figure 8:
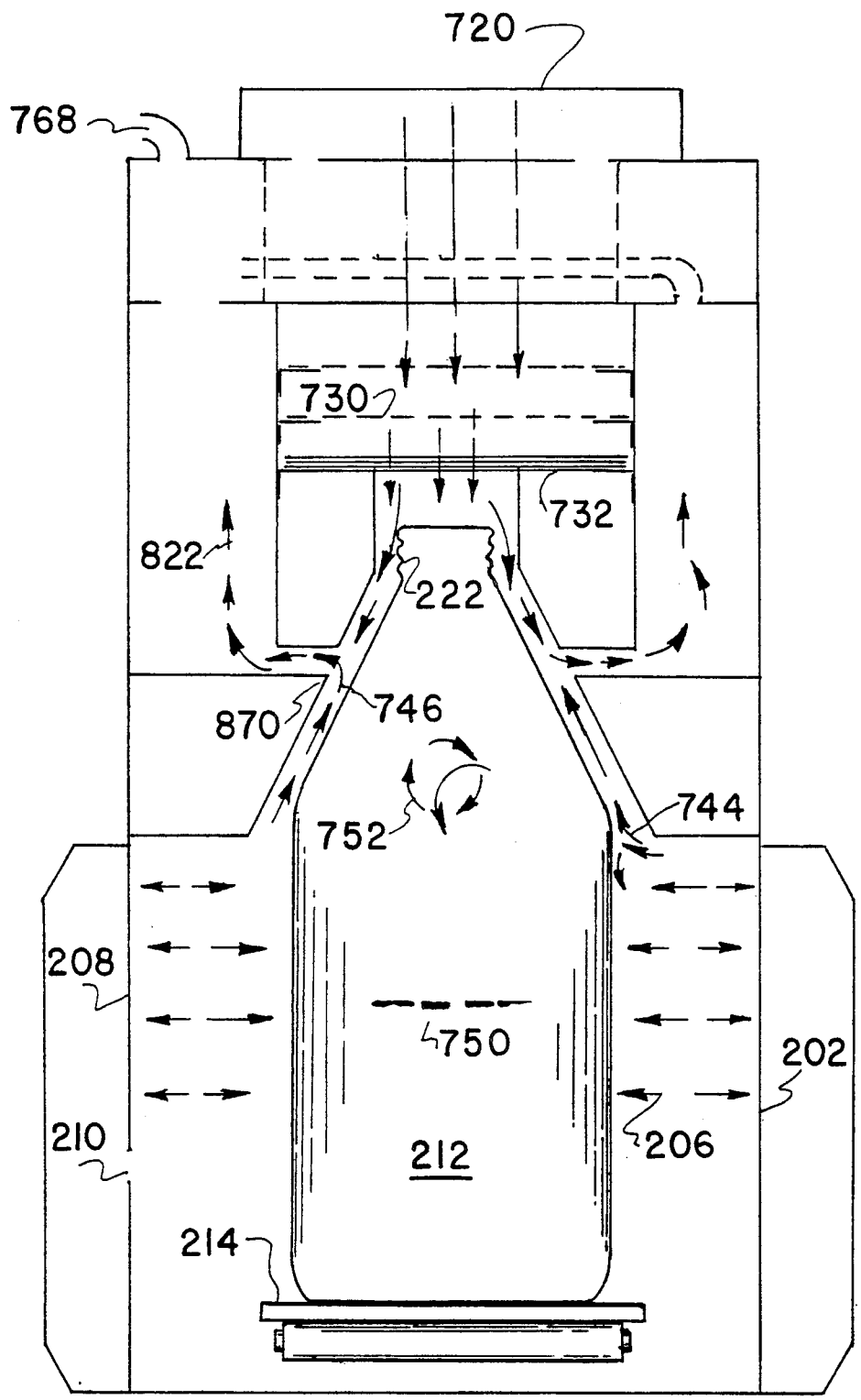
FIG. 8 is an elevational view of another embodiment of the coating hood.

The preferred embodiments of our invention are illustrated in FIGS. 7 and 8. FIG. 7 shows the interaction of a bottle 212 with several gaseous streams as it passes under the center section 700 of the present invention and between a coating-precursor slot 202 and an opposing recirculation slot 210 in opposing wall 208 described in our copending U.S. patent application Ser. No. 07/427,662, filed Oct. 27, 1989. For simplicity, the structure of the coating loop is not shown here. Bottle 212, with body portion 220 and finish region 222, is carried on conveyor 214.

Some of the unintended currents that tend to move coating precursor toward the finish are shown for purposes of illustration here in single arbitrary locations, although it is obvious that such currents are numerous and complex. The improvement current 744, the turbulent current 752, and the convection current 750 are simplistic representations of the deflection of the coating precursor from its intended path, by interaction with the hot, moving ware, represented here by bottle 212. The induced draft 746, in both the present invention and in the prior art, causes part of the process stream 206 to rise and merge with the finish-protection current or air curtain 738, moving from source 720 to exhaust 742. In this embodiment of the present invention, a source of fluid, generally pure air or other nonreactive fluid 740, provides sufficient downwardly-directed energy to stop the upflow of the unintended streams 744, 752, 746 and 750. The source 720 for air 740 is generally a blower, fan, plant air from a remote compression source, or other means known to those skilled in the art, and is not shown here. The air curtain 738 between source 720 and exhaust 742 prevents dilution or displacement of the coating-precursor stream 206 at the shoulder 726 of the bottle 212, where maximum coating thickness is desired.

In a typical operation of the apparatus of FIG. 7, the clean air 740 from source 720 passes through any number of porous distributor plates 730, to provide an even flow of air to diffuser plate 732. The diffuser plate 732 can be, e.g., a perforated metal plate with 2.5-mm. holes, closed spaced on 4-mm. center, porous ceramic, or any other porous medium that allows essentially complete coalescence of the individual small jets. Plates 730 and 732 can, but do not have to, be identical.

An exhaust-impeller apparatus, not shown, but well known to those skilled in the art, is typically of about the same pressure and volume availability or horsepower rating as the source 720 for air 740, and the air-curtain source 748 is typically of lower power, so that a small fraction of the air from combined sources 720 and 748 is forced downward to oppose the rising currents 744, 746 and 752. The flow of process stream 206 past container 212 and rounded shoulder 772 at least partially entrains convection current 750 and other unintended currents, and causes those currents to move with exhaust stream 754. This leaves exhaust 742 removing a major fraction of the combined output of sources 720 and 748 as process exhaust 768, which may be recirculated, or if its makeup is essentially purse air requiring no treatment, discharge to the atmosphere.

Alternatively, and especially for coating small containers, sources 720 and 740 can be individually or collectively some other functional gas such as e.g., steam or flue gas.

FIG. 8 shows an alternative embodiment of the apparatus of the present invention. As described in reference to FIG. 7, source 720 is a stream of gas having no coating precursor, which passes through diffuser plate 732 onto bottle 212 at the finish region 222. Impingement current 744 and convection current 750 tend to move coating precursor upward toward the finish 222; coating precursor carried by these currents is entrained with and removed by the gas stream 740 from source 720, which is itself largely removed by exhaust 742. The deflection of the various currents is represented by arrows 822 in FIG. 8. By the movement of finish-protection stream 822 down past finish 222 and thereafter past horizontal angle 870, that stream at least partially entrains convection current 775 and other unintended currents, and causes those currents to move with exhaust stream 822, for exhaust or recirculation as appropriate.

The operation of the method of the present invention is generally described in reference to FIGS. 7 and 8. The operator sets the flow of air 740 from source 720 to give essentially no coating on the finish. Exhaust stream 742 or 822 is then adjusted to maximize the coating on the shoulder. Irrespective of the disposition of the exhaust stream, whether down, over and out as stream circuit 738, 740 and 742, or down and out as stream circuit 740 and 822, source 720 may be either clean air, stream, flue gas, or other functional fluid, as noted hereinabove, depending upon the mass and shape of the ware being coated, along with other process variables which may affect the coating operation.

A coating-thickness unit (CTU) is a glass-industry unit of about 2.5 Å thickness, and is generally used in describing coatings of the type under discussion in this application. During full-scale tests of the embodiment of FIG. 8, in the course of coating 12-oz beer bottles, the present invention consistently provided a 30- CTU or greater coating on the shoulder, and a 3-CTU or thinner coating on the finish. Concurrent production in the same plant, utilizing equipment of the prior art, was unable to equal this ten-to-one ratio of shoulder-to-finish coating thickness, even with careful attention to the adjustment of process variables.

The utility of the claimed apparatus has been demonstrated by plant runs in which the finish coat was maintained at substantially zero over a period of time long enough to permit process variables to drift off specification if such were to be the case, and has consistently occurred in the past even with the best apparatus of the prior art. However, in the course of such runs employing the apparatus of this invention, coating on the body of the container has been readily kept within thickness limitations without affecting the substantially coating-free finish region, even with operation by personnel unfamiliar with the apparatus. As described with reference to the coating on the finish, the ratio of coating thickness between the finish and the body is readily maintained at ten to one.

Modifications, changes and improvements to the preferred forms of the invention herein described, disclosed and illustrated may occur to those skilled in the art who come to understand the principles and precepts thereof. Accordingly, the scope of the patent to be issued hereon should not be limited to the particular embodiments of the invention set forth herein, but rather should be limited only by the advance by which the invention has promoted the art.

We claim:

1. In an apparatus for coating of glass containers having at least a shoulder and a finish region, the apparatus comprising a coating tunnel, conveyor means, fluid-directing means and gas exhaust-removal means, wherein extraneous upwardly-directed fluid streams deposit coating precursor on the finish region of the container, the improvement which comprises a center section of the coating tunnel in combination with a horizontal gas flow and a downwardly-directed gas stream of sufficient energy to overcome the extraneous upwardly-directed fluid streams, and having exhaust means intermediate the finish and the shoulder of the ware being coated, the horizontal gas flow being so powered as to prevent displacement of the coating-precursor stream from the shoulder of the ware.

2. The apparatus of claim 1 wherein the volume of gas exhausted from the center section is not greater than the total volume of gas supplied to the center section.

3. The apparatus of claim 1 wherein the downwardly-directed gas stream comprises clean air supplied by a blower.

4. The apparatus of claim 1 wherein the downwardly-directed gas stream in the finish region comprises steam.

5. The apparatus of claim 1 wherein the downwardly-directed gas stream in the finish region comprises flue gas.

6. The apparatus of claim 1 wherein the exhaust means is a horizontal air curtain.

7. The apparatus of claim 1 wherein the exhaust means is a pair of opposed longitudinal slits equipped with a powered impeller.

* * * * *